Feb. 11, 1969 A. J. COUNTRYMAN ET AL 3,426,415

PRINTED CIRCUIT ASSEMBLY APPARATUS

Filed Sept. 26, 1966 Sheet 1 of 3

INVENTORS.
ALBERT J. COUNTRYMAN
GEORGE R. COGAR

BY Bruns & Jenney, Atty's

INVENTORS.
ALBERT J. COUNTRYMAN
GEORGE R. COGAR

INVENTORS
ALBERT J. COUNTRYMAN
GEORGE R. COGAR

United States Patent Office 3,426,415
Patented Feb. 11, 1969

3,426,415
PRINTED CIRCUIT ASSEMBLY APPARATUS
Albert J. Countryman, Mohawk, and George R. Cogar, Frankfort, N.Y., assignors to Mohawk Data Sciences Corporation, Herkimer, N.Y., a corporation of New York
Filed Sept. 26, 1966, Ser. No. 581,898
U.S. Cl. 29—203 11 Claims
Int. Cl. H01r *43/00;* B23q *7/10*

This invention relates generally to assembly apparatus, and has particular reference to a novel apparatus for assembling electrical components on a printed circuit board.

Briefly stated, the invention contemplates an assembly apparatus comprised of a novel combination of parts wherein electrical components that are to be mounted on a printed circuit board are carried by a magazine that can be selectively moved to deliver the various components in any desired sequence to a work station at which the printed circuit board is located. More specifically, the electrical components are stored in trays with each tray having like components therein, and attached to each tray is a flexible mask adapted to overlie the circuit board. This mask has cut out areas to show the operator of the apparatus where the particular components in the tray should be mounted on the board.

The magazine that carries the electrical components is moved by an air-oil system having a simple operator control for initiating movement. Termination of the magazine movement is automatic and is controlled by a pneumatic sensor arrangement which causes the magazine to stop at the next successive tray location. However, if the components in one of the other trays should be mounted on the circuit board first, the operator causes further movement of the magazine until the tray having the desired components is presented to the work station.

The primary object of the present invention is to provide a novel apparatus which enables electrical components to be assembled on a circuit board with greater speed and accuracy than has been possible by means employed heretofore.

Another object is to provide an apparatus of the character described which is inexpensive to construct and operate, and has a relatively compact form.

A further object is to provide an apparatus of the character described having very simple operator controls.

A more specific object of the invention is to provide a printed circuit assembly apparatus wherein each kind of electrical component to be assembled on the circuit board is contained in a tray having an attached mask adapted to overlie the board and show where the particular components in the tray should be mounted.

Another specific object is to provide a printed circuit assembly apparatus wherein the trays for the electrical components are carried by a selectively movable magazine.

Still another specific object is to provide a printed circuit assembly apparatus wherein movement of the magazine for the electrical components is effected by an efficient and compact fluid system which can be selectively controlled by the operator.

Other objects and advantages will become apparent from the following description taken in conjunction with the accompanying drawings in which.

Figures 1, 2, 3, 4:
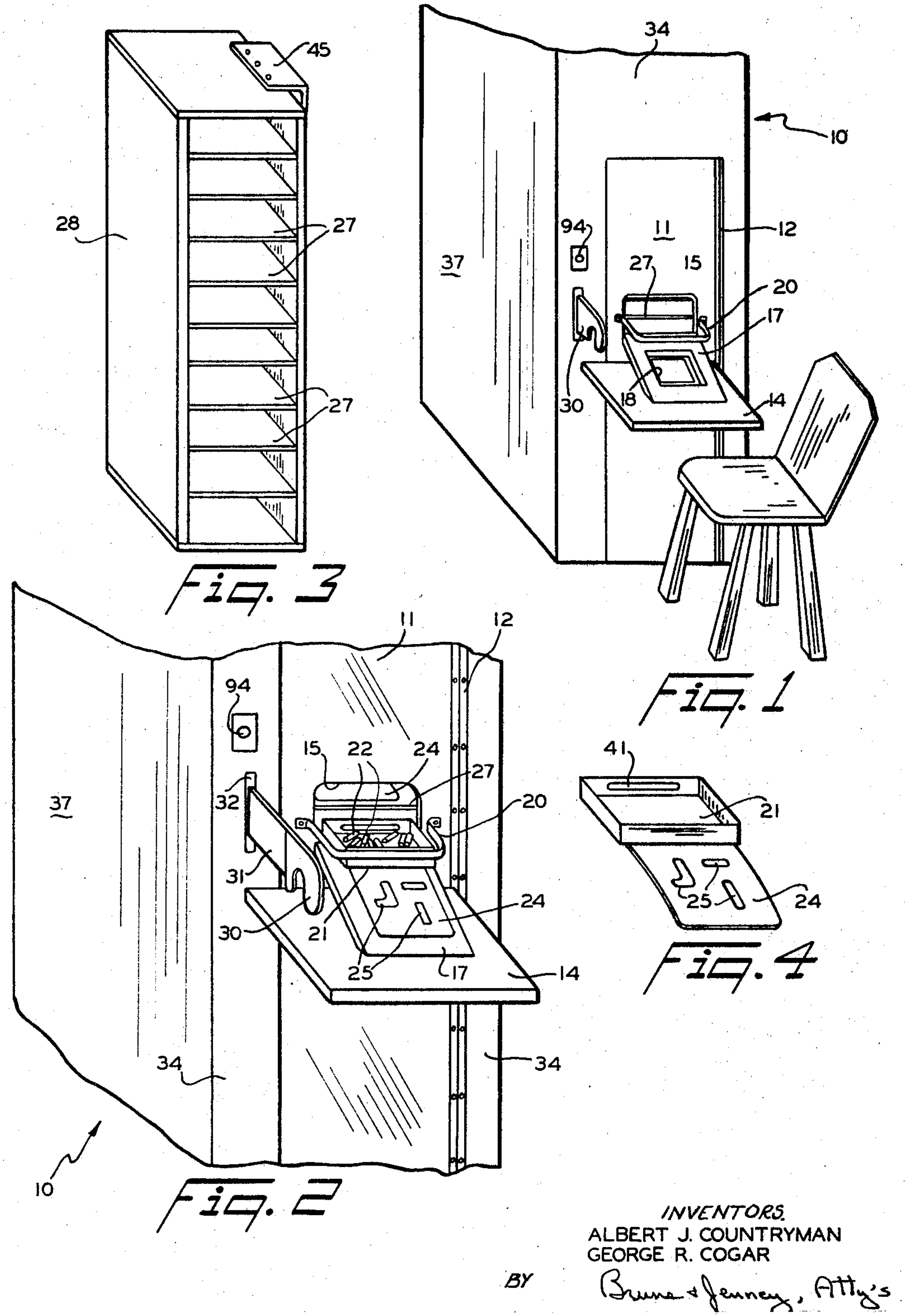
FIGURE 1 is a fragmentary front perspective view of an assembly apparatus embodying the invention.
FIGURE 2 is an enlarged portion of the apparatus of FIGURE 1.
FIGURE 3 is a front perspective view of the magazine for the assembly apparatus.
FIGURE 4 is a top perspective view of one of the electrical component trays and attached mask.

Having reference now to the drawings, wherein like reference numbers designate the same part in each of the views, 10 generally indicates a booth or cabinet having a front door 11 hinged at 12. Mounted on the door is a shelf 14 and spaced above the shelf is an opening 15 through the door. As best shown in FIGURES 1 and 2, a second, inclined shelf 17 extends from the lower edge of the opening or window 15 down to the shelf 14, the inclined shelf having a cut-out area 18, FIGURE 1, adapted to receive a printed circuit board, not shown.

Extending outwardly from the cabinet door in front of the lower part of window 15 is a bracket 20 which serves as a stop for a tray 21 containing electrical components 22 to be mounted on the circuit board. In accord with the invention, there are a plurality of such trays, each with a different kind or value of component and attached to the front lower edge of each tray is a mask 24 having cut-out areas 25 to show where the particular components in the tray should be mounted on the circuit board. Thus, when a selected tray is moved from inside the cabinet out through window 15 until it engages the stop 20, it attached mask which is made of flexible sheet material such as Mylar will overlie and be in registry with a circuit board mounted in the cut-out area of the inclined shelf 17.

The component trays 21 are supported in the cabinet on the shelves 27 of a vertically movable magazine 28, there being one tray per shelf whereby the trays are arranged in vertically stacked relation. In using the apparatus, a magazine having trays with the necessary components for the particular circuit being assembled is inserted in the cabinet and the proper board for the circuit is positioned on shelf 17. The operator, seated in front of the shelf 14, then pulls the handle 30 of the actuating means outwardly and this causes the component tray 21 that is aligned with window 15 to be moved out against the stop 20 with its mask 24 in overlying registry with the circuit board, as shown in FIGURE 2 and described above. In this connection, the location occupied by the circuit board may hereinafter be referred to as the work station, the location occupied by a tray in engagement with the stop 20 may be referred to as a station contiguous with the work station and the electrical components may be referred to as work pieces.

After the operator pulls handle 30 out to position a tray 21 as shown in FIGURE 2, the components in the tray are mounted on the circuit board at the places indicated by the cut-outs 25 in the mask. For any given tray, all of the components in it are the same and the mask is coordinated with those components so the operator needs only to reach in the tray and withdraw as many components as the mask indicates are required. When the components have been mounted on the circuit board, the operator pushes the handle 30 all the way in and this returns the tray and mask to the magazine and causes the latter to move vertically and bring another tray into alignment with the window 15 and stop 20, at which time movement of the magazine is terminated.

Figures 5, 6, 7, 8:
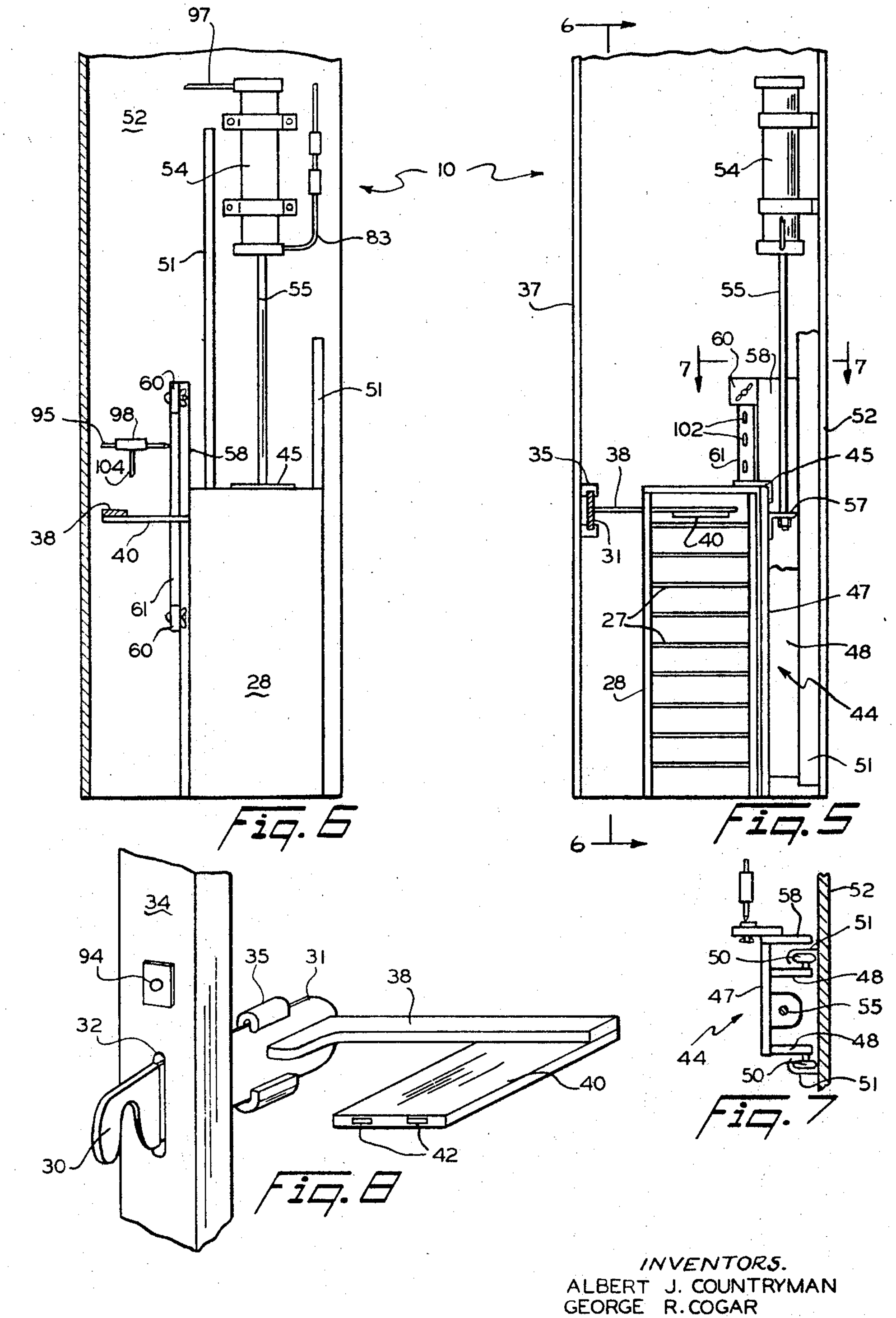
FIGURE 5 is a fragmentary front elevation of the apparatus with the front wall and door removed and certain parts in section.
FIGURE 6 is a vertical section taken substantially on line 6—6 of FIGURE 5.
FIGURE 7 is a fragmentary horizontal section taken substantially on line 7—7 of FIGURE 5.
FIGURE 8 is an enlarged perspective view of the actuating means for the assembly apparatus.

The handle 30 is mounted on the outer end of a slide 31 which passes through a slot 32 in the front wall 34 of the cabinet and is slidably supported at its inner end as by a bracket 35, the latter being mounted on the left sidewall 37 of the cabinet as shown in FIGURE 5. Secured to the inner end of the slide 31 is a cross arm 38, and mounted on the end of the cross arm is a pusher member 40 which extends back toward the front of the cabinet as shown in FIGURE 8. The free end of the pusher 40 is in substantial alignment with the window 15 in the cabinet door and the stop 20.

The magazine 28 is open at the back as well as at the front and when it is in its lowermost position, and the handle 30 is pushed all the way in, the free end of the pusher member 40 will be located just behind the back of the magazine and just above its top shelf 27 as indicated in FIGURE 5. The free end of the pusher is thus in position to engage the back side of a tray 21, and it does engage the tray and push it out against the stop 20 when the handle is pulled out as above described. To move the tray back into the cabinet when the handle is pushed in, the back side of each tray is provided with a strip 41 of paramagnetic material, FIGURE 4, which will be attracted by one or more permanent magnets 42 embedded in the end of the pusher 40, see FIGURE 8. Means (not shown) are provided, however, to prevent the pusher from drawing any of the trays beyond the back side of the magazine. As will be apparent, upward movement of the magazine will bring the pusher into alignment with the trays on the other shelves of the magazine.

Vertical movement of the magazine 28 is effected by means of a carriage indicated generally at 44 in FIGURES 5 and 7, the magazine being detachably connected to the carriage by a top bracket 45, FIGURES 3 and 5. The bracket 45 engages or is hung upon the upper edge of a vertical support 47 which forms the main member of the carriage. Connected to one side of the support 47 is a pair of vertical leg members 48, and each leg carries a roller 50 adjacent its upper and lower ends. The rollers on each leg are received in a track 51 having a C-shaped cross section, the two tracks being mounted in vertical, parallel relation on the right sidewall 52 of the cabinet 10 to guide the carriage for vertically reciprocable movement.

Carriage movement is accomplished by an air-oil cylinder 54 mounted on the cabinet wall 52 near the top thereof. Connected to the piston (not shown) of the cylinder is a depending rod 55 that is secured at its lower end to a bracket 57 mounted on the carriage support member 47. The operation of cylinder 54 will be presently described. The carriage also includes an elongated upstanding member 58 that is secured to the rear edge of the support 47. Member 58 extends above the rest of the carriage as shown in FIGURES 5 and 6 and has mounted near its top and midpoint a pair of cross pieces 60 between which is stretched a strip of tape 61. This tape is a part of the magazine movement control means to be described hereinafter.

Figure 9:
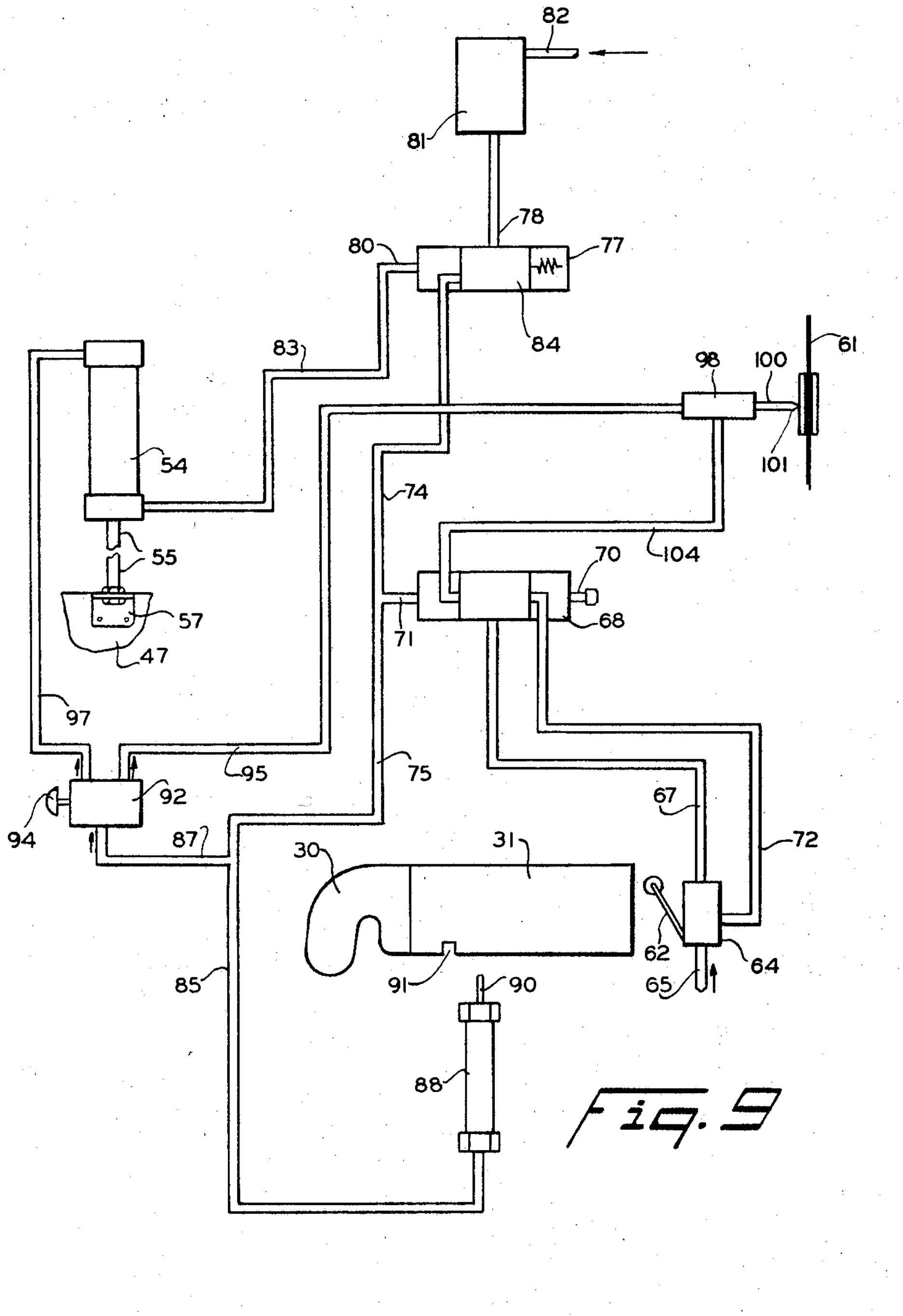
FIGURE 9 is a schematic diagram of the fluid system for moving the magazine of the assembly apparatus.

The fluid system for effecting magazine movement utilizes both air and oil and is shown schematically in FIGURE 9. As stated above, when the operator pushes the handle 30 in after mounting the components of a particular tray on the circuit board, the tray and its mask are returned to the magazine 28 and the latter then moves vertically to bring another tray into alignment with the cabinet window 15. The inward movement of handle 30, FIGURES 8 and 9, causes the inner end of the slide 31 to engage a roller on the movable control arm 62 of a four-way air valve 64 and this is what initiates movement of the magazine as will be explained.

Valve 64 receives air at a pressure of 100 p.s.i. through an inlet line 65 and this air leaves the valve through a pilot line 72 when the arm 62 is in the position shown in FIGURE 9, out of engagement with slide 31. Line 72 goes to a three-way air piloted valve 68 having outlets 70 and 71 at the ends thereof. The spool (not shown) of valve 68 will be shifted by the air in pilot line 72 thereby opening a passage through the valve from a line 67 to the outlet line 71. However, before arm 62 is actuated by slide 31 the line 67 is blocked in valve 64 and air cannot flow into it. Thus, there is no magazine movement unless the handle 30 is pushed all the way into the cabinet and arm 62 has been moved by the slide end.

Actuation of the valve arm 62 shifts the spool (not shown) of valve 64 causing air from the inlet line 65 to leave the valve through line 67 rather than line 72. Once the line 67 is unblocked, therefore, the air passes through the line and through valve 68 leaving the latter by way of outlet 71.

Valve outlet 71 leads into lines 74 and 75, and line 74 leads to a two-way air piloted valve 77 having an oil inlet and outlet at 78 and 80, respectively. The oil inlet is connected to an oil reservoir 81 having an air inlet 82 for admitting air at a pressure of approximately 90 p.s.i. to keep the oil under pressure. The oil outlet 80 leads through line 83 to the bottom of air-oil cylinder 54 so that the oil will act on the under side of the piston that is connected to rod 55. As described above, the lower end of the rod is connected to a bracket 57 mounted on the magazine carriage support member 47.

Within the valve 77, the oil inlet 78 is normally blocked by a spring biased spool indicated diagrammatically at 84 but when air is allowed to pass through valve 68 and line 74, it acts against the spring bias on spool 84 causing the latter to move to the right as shown in FIGURE 9. This unblocks the oil inlet and allows oil from the reservoir to flow through valve 77 to the cylinder 54 where it lifts the piston and the magazine carriage connected thereto.

The other line 75 connected to valve outlet 71 branches into lines 85 and 87, and line 85 leads to the cylinder 88 of an interlocking device having a plunger 90 arranged to cooperate with a notch 91 in the slide 31. The plunger is normally spring biased into a retracted position as shown in the drawing but when the slide has been pushed in to actuate the valve arm 62 and thereby initiate carriage movement, the air in line 85 causes the plunger 90 to move farther out of the cylinder 88 against the spring bias and engage in notch 91 whereby the handle 30 and slide are positively held in their innermost valve arm actuating position. Such an interlock is necessary since the operator should not be able to pull the handle out and move a component tray out of the magazine while the latter is moving.

The air line 87 leads to the inlet side of a manually operable valve 92, the valve having a manual push button 94 located on the front of the cabinet within easy reach of the operator as best shown in FIGURE 2. Valve 92 has two outlets connected to lines 95 and 97 and is biased so that its inlet is normally in communication with the outlet line 95. This line leads to a pneumatic booster 98 connected to a sensor device 100 which emits through a nozzle end 101 a jet of air under pressure. The nozzle end abuts against the tape 61, previously referred to, that is stretched between the cross pieces 60 mounted on the magazine carriage as shown in FIGURES 5 and 6.

The tape 61 is formed with elongated openings 102 as shown in FIGURE 5 and the sensor nozzle 101 is in registry with these openings. The tape is mounted on the carriage so that an opening of the proper length is opposite the nozzle for the length of time that carriage movement should occur to move one shelf 27 of the magazine out of alignment with cabinet window 15 and the next shelf into alignment therewith. Accordingly, when a magazine shelf is in alignment with the window, the tape opening terminates and one of the webs of tape that separates the openings is presented to the sensor nozzle.

When a tape opening 102 is presented to the sensor nozzle, the jet of air is emitted from the nozzle and passes through the opening, and the sensor has no effect on the air and oil flow described above. Thus, as long as a tape opening 102 is presented to the nozzle, oil flows through the line 83 and movement of the magazine carriage continues. However, when by reason of the continued movement of the carriage the opening terminates and a tape web is presented to the nozzle, the web prevents the air from escaping through the nozzle and it is diverted into a line 104 leading from the booster back to valve 68. The air from line 104 shifts the spool of valve 68 so that it again blocks the line 67 whereupon no further air flows through lines 74 and 75. As a result, the spring bias acting on spool 84 shifts the spool so that no further oil flows into cylinder 54, and movement of the carriage stops.

As will be apparent, the lengthwise position of tape 61 can be adjusted, FIGURES 5 and 6, so that the webs between the openings 102 will block the sensor nozzle when the component trays 21 are in exact registry with the cabinet window 15 and stop 20. Similarly, the length of the tape openings 102 will be governed by the distance between the magazine shelves 27 or, in other words, by the extent of magazine travel that is desired between the registering stops.

To reverse the direction of travel of the carriage, either because the limit of upward movement has been reached or for any other reason, the operator simply pushes the button 94 which shifts the spool (not shown) of valve 92 so that air entering the valve leaves by line 97 rather than by line 91, it being understood that at the same time handle 30 must be pushed in so that valve arm 62 has been actuated. The air in line 97 enters the top of cylinder 54 and acts on the top of the piston therein. Since the air is still at a pressure of almost 100 p.s.i., this will force the piston (and hence the carriage) downwardly forcing the oil beneath the piston back through line 83 and into the reservoir, the pressure of the air above the piston being sufficient to overcome both the spring bias of the valve spool 84 and the 90 pound air pressure in line 82.

From the foregoing description, it will be apparent that the invention disclosed herein provides a novel and highly useful apparatus which enables electrical components to be assembled on a printed circuit board with great speed and accuracy. As will be understood by those familiar with the art, the invention can be embodied in other specific forms without departing from the spirit or essential characteristics thereof. The embodiment disclosed is therefore to be considered in all respects as illustrative rather than restrictive, the scope of the invention being indicated by the appended claims.

What is claimed is:

1. In an apparatus having a work station, means for bringing work pieces to a position in close proximity with the work station comprising a magazine having a plurality of work piece support positions, means to effect linear movement of said magazine relative to said work station, and control means coactable with said movement effecting means for positioning said magazine so that a selected work piece support position is moved into a predetermined location adjacent said work station, said control means including additional means for moving the work pieces at said selected support position into close proximity with said work station.

2. Apparatus as defined in claim 1 wherein said movement effecting means includes a movable carriage, said magazine being detachably secured to said carriage.

3. Apparatus as defined in claim 1 wherein said magazine is moved vertically by said movement effecting means and said magazine work piece support positions comprise a plurality of shelves arranged one above the other.

4. Apparatus as defined in claim 1 wherein said work station is adapted to support a printed circuit board and said work pieces are electrical components to be mounted on said board.

5. Apparatus as defined in claim 4 together with a plurality of trays for said electrical components, each tray being located at one of said magazine work piece support positions and having like components therein, said trays being moved by said aditional control means to move the electrical components into close proximity with said work station.

6. Apparatus as defined in claim 5 together with a flexible mask element extending from each tray and arranged to overlie the circuit board when the trays are moved by said additional control means, each said mask having cutout areas to indicate where the electrical components in its tray should be mounted on the circuit board.

7. In an apparatus for selectively bringing work pieces to a station contiguous with a work station, a magazine located near the work station and having a plurality of supports for a number of different work pieces, and a fluid system for moving said magazine, said fluid system being operative to move a selected one of the magazine work piece supports into alignment with said contiguous station, said fluid system including actuating means to initiate movement of said magazine and additional means put into operation by the magazine movement to terminate same when a magazine work piece support is brought into alignment with said contiguous station.

8. Apparatus as defined in claim 7 wherein said actuating means includes means to move the work pieces at a particular magazine support from the support to said contiguous station.

9. Apparatus as defined in claim 7 wherein said fluid system includes piston means operatively connected to said magazine for moving same.

10. Apparatus as defined in claim 7 wherein said fluid system includes coacting pneumatic sensor means and a perforate member for controlling termination of the magazine movement.

11. Apparatus as defined in claim 10 wherein said pneumatic sensor means is fixed and said perforate member is movable with said magazine, said perforate member being in the form of a tape.

References Cited

UNITED STATES PATENTS

| | | | |
|---|---|---|---|
| 2,522,316 | 9/1950 | Steiner | 221—95 |
| 3,292,249 | 12/1966 | Banke | 29—211 |
| 3,333,673 | 8/1967 | Zemek | 198—19 |
| 3,341,928 | 9/1967 | Naumann | 29—203 |

THOMAS H. EAGER, *Primary Examiner.*

U.S. Cl. X.R.

29—211; 198—19; 221—95